United States Patent [19]
Fetherston et al.

[11] Patent Number: 5,693,376
[45] Date of Patent: Dec. 2, 1997

[54] METHOD FOR PLASMA SOURCE ION IMPLANTATION AND DEPOSITION FOR CYLINDRICAL SURFACES

[75] Inventors: Robert P. Fetherston; Muhammad M. Shamim; John R. Conrad, all of Madison, Wis.

[73] Assignee: Wisconsin Alumni Research Foundation, Madison, Wis.

[21] Appl. No.: 494,192

[22] Filed: Jun. 23, 1995

[51] Int. Cl.$^6$ ................................................. C23C 14/00
[52] U.S. Cl. .................. 427/523; 204/192.12; 427/237; 427/238; 427/249; 427/255.1; 427/294; 427/299; 427/444; 427/534; 427/535; 427/570; 427/577
[58] Field of Search .................... 427/570, 534, 427/237, 535, 238, 569, 294, 577, 523, 249, 299, 255.1, 444; 204/192.12

[56] References Cited

U.S. PATENT DOCUMENTS

| | | | |
|---|---|---|---|
| 4,587,430 | 5/1986 | Adler | 250/423 R |
| 4,764,394 | 8/1988 | Conrad | 427/38 |
| 4,937,205 | 6/1990 | Nakayama et al. | 437/165 |
| 5,013,578 | 5/1991 | Brown et al. | 427/37 |
| 5,126,163 | 6/1992 | Chan | 427/38 |
| 5,212,425 | 5/1993 | Goebel et al. | 315/111.21 |
| 5,218,179 | 6/1993 | Matossian et al. | 219/121.43 |
| 5,244,375 | 9/1993 | Laurence et al. | 425/406 |
| 5,296,272 | 3/1994 | Matossian et al. | 427/523 |
| 5,296,714 | 3/1994 | Treglio | 250/492.3 |
| 5,306,531 | 4/1994 | Laurence et al. | 427/569 |
| 5,330,800 | 7/1994 | Shumacher et al. | 427/523 |
| 5,354,381 | 10/1994 | Sheng | 118/723 E |
| 5,374,456 | 12/1994 | Matossian et al. | 427/570 |
| 5,389,195 | 2/1995 | Ouderkirk et al. | 156/643 |

FOREIGN PATENT DOCUMENTS 9318201  9/1993  WIPO .

OTHER PUBLICATIONS

M. Renier, et al., "A new low energy ion implanter for bombardment of cylindrical surfaces", Vacuum, vol. 35, No. 12, 1985, pp. 577–578 (no month avail.).

J.R. Conrad, et al., "Plasma source ion–implantation technique for surface modification of materials", J. Appl. Phys. vol. 62, No. 11, Dec. 1987, pp. 4591–4596.

J.R. Conrad, et al., "Manufacturing Aspects of Plasma Source Ion Implantation", PED, vol. 41, 1989, pp. 65–70. (no month avail.).

(List continued on next page.)

*Primary Examiner*—Bernard Pianalto
*Attorney, Agent, or Firm*—Foley & Lardner

[57] ABSTRACT

Uniform ion implantation and deposition onto cylindrical surfaces is achieved by placing a cylindrical electrode in coaxial and conformal relation to the target surface. For implantation and deposition of an inner bore surface the electrode is placed inside the target. For implantation and deposition on an outer cylindrical surface the electrode is placed around the outside of the target. A plasma is generated between the electrode and the target cylindrical surface. Applying a pulse of high voltage to the target causes ions from the plasma to be driven onto the cylindrical target surface. The plasma contained in the space between the target and the electrode is uniform, resulting in a uniform implantation or deposition of the target surface. Since the plasma is largely contained in the space between the target and the electrode, contamination of the vacuum chamber enclosing the target and electrodes by inadvertent ion deposition is reduced. The coaxial alignment of the target and the electrode may be employed for the ion assisted deposition of sputtered metals onto the target, resulting in a uniform coating of the cylindrical target surface by the sputtered material. The independently generated and contained plasmas associated with each cylindrical target/electrode pair allows for effective batch processing of multiple cylindrical targets within a single vacuum chamber, resulting in both uniform implantation or deposition, and reduced contamination of one target by adjacent target/electrode pairs.

34 Claims, 7 Drawing Sheets

OTHER PUBLICATIONS

K. Sridharan, et al., "Ion Beam Enhanced Deposition of Titanium–Nitride on Inconel 718", Mat. Res. Bull., vol. 26, No. 5, 1991, pp. 367–373. (no month avail.).

Ling Xie, et al., "Production of Diamond–Like Carbon Films By Plasma Source Ion Implentation", Proc. Mater. Res., vol. 4, 1992, pp. 427–432 (no month avail.).

K. Sridharan, et al., "Carbon Ion Implantation of Pure Iron", Scripta Metallurgica and Materialia, vol. 26, No. 7, 1992, pp. 1037–1042. (no month avail.).

J. Chen, et al., "Structure and Properties of Amorphous Diamond–Like Carbon Films Produced by Ion Beam Assisted Plasma Deposition", J. Mat. Eng. and Performance, vol. 2, No. 6, Dec. 1993, pp. 839–842.

Shamim M. Malik, et al., "Overview of plasma source ion implantation research at Univeristy of Wisconsin–Madison", J. Vac. Sci. Technol. B, vol. 12, No. 2, Mar./Apr. 1994, pp. 843–849.

5,693,376

METHOD FOR PLASMA SOURCE ION IMPLANTATION AND DEPOSITION FOR CYLINDRICAL SURFACES

This invention was made with United States Government support awarded by DOE (CRADA) Grant No. 9-XC3-8362E-1. The United States Government has certain rights in this invention.

FIELD OF THE INVENTION

This invention pertains generally to the field of surface treatment and particularly to surface treatment by ion implantation and deposition techniques.

BACKGROUND OF THE INVENTION

Ion implantation and deposition are used to improve the surface characteristics of a variety of materials, including metals, ceramics, and plastics. Ion implantation and deposition allow new materials to be produced, having new surface properties, without the thermodynamic constraints of more conventional techniques. In particular, ion implantation and deposition can be used to improve greatly the friction, wear, and corrosion resistance properties of the surfaces of metals. The properties of ceramic components and ceramic cutting tools can also be improved by ion implantation or deposition.

In the conventional ion implantation process, ions are formed into a beam and accelerated to high energy before being directed into the surface of a solid target. The relatively high cost of this process has limited its use to high unit cost items having very special applications. A significant factor in the substantial production costs associated with conventional ion implantation techniques is that significant, and time-consuming, manipulation of the ion beam and the target is required to obtain implantation over the entire surface of a three dimensional target. In the conventional ion implantation method, the ions are extracted from a plasma source and focused into a beam, which is accelerated to the desired energy, and then rastered across one face of the target, to uniformly implant the surface of that face. Because of the line-of-sight nature of this ion implantation technique, a manipulator platform or stage is required which can support the target for rotation in the beam so that all sides of the target can be implanted. The need to manipulate a three dimensional target to allow all sides of the target to be implanted adds cost and complexity, constrains the maximum size of the target which can be implanted, and increases the-total time required to obtain satisfactory implantation of all target surfaces for relatively large targets. Because the ions travel to the target in a largely unidirectional beam, it is often necessary to mask targets having convex surfaces so that ions are allowed to strike the target only at angles substantially normal to the target surface. Normal incidence of ions to the surface is preferred since, as the difference in the angle of the incidence from the normal increases, sputtering increases, and the retained net dose of implanted material in the target decreases. It would be impossible to use this method of ion implantation to implant, or deposit, materials on the inner surface of a cylindrical object.

Plasma source ion implantation (PSII) provides significantly improved production efficiencies in ion implantation of three dimensional materials by achieving implantation from all sides of the target simultaneously. This method was introduced in U.S. Pat. No. 4,764,394, entitled Method and Apparatus for Plasma Source Ion Implantation, issued to John R. Conrad, the disclosure of which is incorporated herein by reference. In the PSII process the target to be implanted is surrounded by the plasma source within an evacuated chamber. A high negative potential pulse is then applied to the target relative to the walls of the chamber to accelerate ions from the plasma, across the plasma sheath, toward the target, in directions substantially normal to the surface of the target at the points where the ions impinge upon the surface. Multiple pulses may be applied between the target and the chamber walls in rapid succession to perform multiple implantations until a desired concentration of implanted ions within the target object is achieved.

For PSII implantation the ion source plasma surrounding the target object is formed by introducing the ion source material, in a gas or vapor form, into the highly evacuated space within the confining chamber. The gaseous material may then be ionized in a conventional manner. Consequently, a plasma is formed which completely surrounds the target object itself so that ions may be implanted into the target from all sides, if desired. Since the target need not be manipulated, complicated target manipulation apparatus is not required. Multiple targets, properly spaced within the plasma, may be implanted simultaneously by the PSII process.

The PSII process can also be used to provide surface coatings through ion deposition. For ion deposition of thin films the voltage level applied to the target is reduced. Since the energy of the ions impacting the target surface is also reduced, the ions will not be driven deeply into the target surface but will tend to deposit on, or just under, the surface. At low energies, and with the appropriate plasma composition, a diamond-like carbon (DLC) coating can be produced from a methane or acetylene plasma. These DLC coatings are characterized by extremely high hardness, low friction and chemical inertness.

Pure metal, alloy, or metallic compound coatings have also been deposited using the PSII process in an ion-assisted deposition (IAD) mode. In the IAD process a radio frequency voltage source is applied to a sputter cathode made of the metal to be deposited via a capacitively or inductively tuneable matching network. This generates a plasma in a gas such as argon whose ions then impact on the cathode, sputtering material therefrom, which is then drawn by an electrical pulse applied to the target, for deposition on the surface of the target.

It is difficult in such plasma processing to provide a uniform surface coating on the inside of a cylinder, and uniform implantation or deposition on the outer surface of a cylinder is sometimes also difficult, especially in batch processing where many cylindrical targets are to be mounted in a vacuum, because of a lack of uniformity of the plasma surrounding, or within, the cylindrical target throughout the implantation/deposition period. One prior technique for obtaining uniformity on cylindrical surfaces involved rotating the target object. However, this is relatively difficult and expensive to do within the vacuum of a PSII chamber and defeats one-of the advantages of PSII over the conventional ion beam technique.

In addition, typically during IAD and DLC deposition processes, the walls of the PSII vacuum chamber become contaminated by the sputtered, or otherwise deposited, material. This necessitates the frequent cleaning of the inside of the chamber, or the use of disposable stainless steel liners for the entire chamber.

SUMMARY OF THE INVENTION

In accordance with the present invention a plasma source ion implantation (PSII) process is employed in such a manner as to uniformly implant or deposit material either (or both) inside the bore and on the outer surface of a cylindrical target. In addition to providing such uniformity, the present invention prevents excess deposition material from contaminating the PSII chamber walls. The present invention may be utilized to provide ion implantation of the target or to provide deposition to the surface of the target, including deposition of diamond like carbon (DLC) coatings or of sputtered metallic material through an ion assisted deposition (IAD) process.

The apparatus of the invention utilizes a coaxial and conformal relationship between the cylindrical target and a second cylindrically shaped electrode. The space between the coaxially located target cylinder and the cylindrical electrode contains the plasma in a uniformly distributed space adjacent to the target surface. Containing the plasma in this manner also reduces contamination of the PSII vacuum chamber walls.

The present invention may be used to form a uniform (e.g., DLC) coating deposited on the outer surface of a cylindrical object (such as a piston). The cylindrical object to be coated is placed in the PSII vacuum chamber inside, and coaxial to, a cylindrical electrode. The PSII chamber is evacuated and a gas to be ionized is admitted to the chamber. A high voltage-signal may be applied between the target and the cylindrical electrode to ionize the gas surrounding the target and inside the electrode. The voltage differential applied as a pulse then accelerates the ions toward the surface of the target to be deposited thereon. Since the plasma may be kept uniform around the circumference of the cylindrical target a uniform coating is deposited on the surface. Also, since the plasma is largely contained within the cylindrical electrode, stray deposition ions are less likely to contaminate the inner surface of the PSII chamber. Furthermore, the cylindrical electrodes may be mounted to be removable and thus easier to clean than the inside of the PSII vacuum chamber wall.

The outer electrode may alternatively be replaced by a cylindrical cathode made of material to be sputtered onto the surface of the target. In this case, ionization may be achieved, for example, by the application of a radio frequency (rf) voltage source to the cathode. The coaxial relationship between the target and the electrode is beneficial in uniformly depositing ions from the electrode into the surface of the target.

By reversing the relationship between the target and electrode described above, a uniform deposition or implantation of the inner bore surface of a cylindrical target (such as the interior surface of a pipe or an automobile engine cylinder) may be achieved in accordance with the present invention. In this case the cylindrical electrode is centrally located coaxially inside the bore of the cylindrical target. A high voltage applied between the target and the center electrode generates a plasma from the gas located between the center electrode and the inner surface of the target. The plasma ions are thereby accelerated away from the electrode, outward toward the inner surface of the target. Since the plasma is radially uniform inside the target cylinder, a uniform deposition is achieved on the inner surface of the target. This process may also be used to deposit sputtered metal material on the inner surface of a cylinder by replacing the cylindrical electrode with a cylindrical metal cathode composed of the material to be sputtered. In either case, the deposition ions, or sputtering material, are largely contained within the target cylinder and, therefore, contamination of the vacuum chamber wall by these materials is reduced.

Though the present invention is particularly useful for deposition onto cylindrical surfaces, the invention may also be used for ion implantation into the inner bore or outer surfaces of a cylinder. Therefore, any material which is desired to be deposited, or implanted, may be used as the basis of the plasma used in the present invention. Additionally, any material which may be implanted or coated using a PSII technique may be used as the target in the present invention. Also, any commonly used sputtering material may be utilized for the sputtering electrode in the sputtering deposition method of the present invention. Further, the plasma may be generated from the gasses of interest by any technique.

The present invention is particularly well suited to batch processing applications. When many objects are processed in a batch within a single vacuum chamber each coaxial arrangement, in effect, acts as its own plasma source, independent of the other similar arrangements within the same chamber. As a consequence, each object receives the same exposure to a uniform plasma and, therefore, a predictable and uniform coating with respect to the other objects. As a result, the present invention is capable of easy scale-up and predictable results.

Further objects, features, and advantages of the present invention will be apparent from the following detailed description when taken in conjunction with the accompanying drawings.

DETAILED DESCRIPTION OF THE INVENTION

Figure 1:
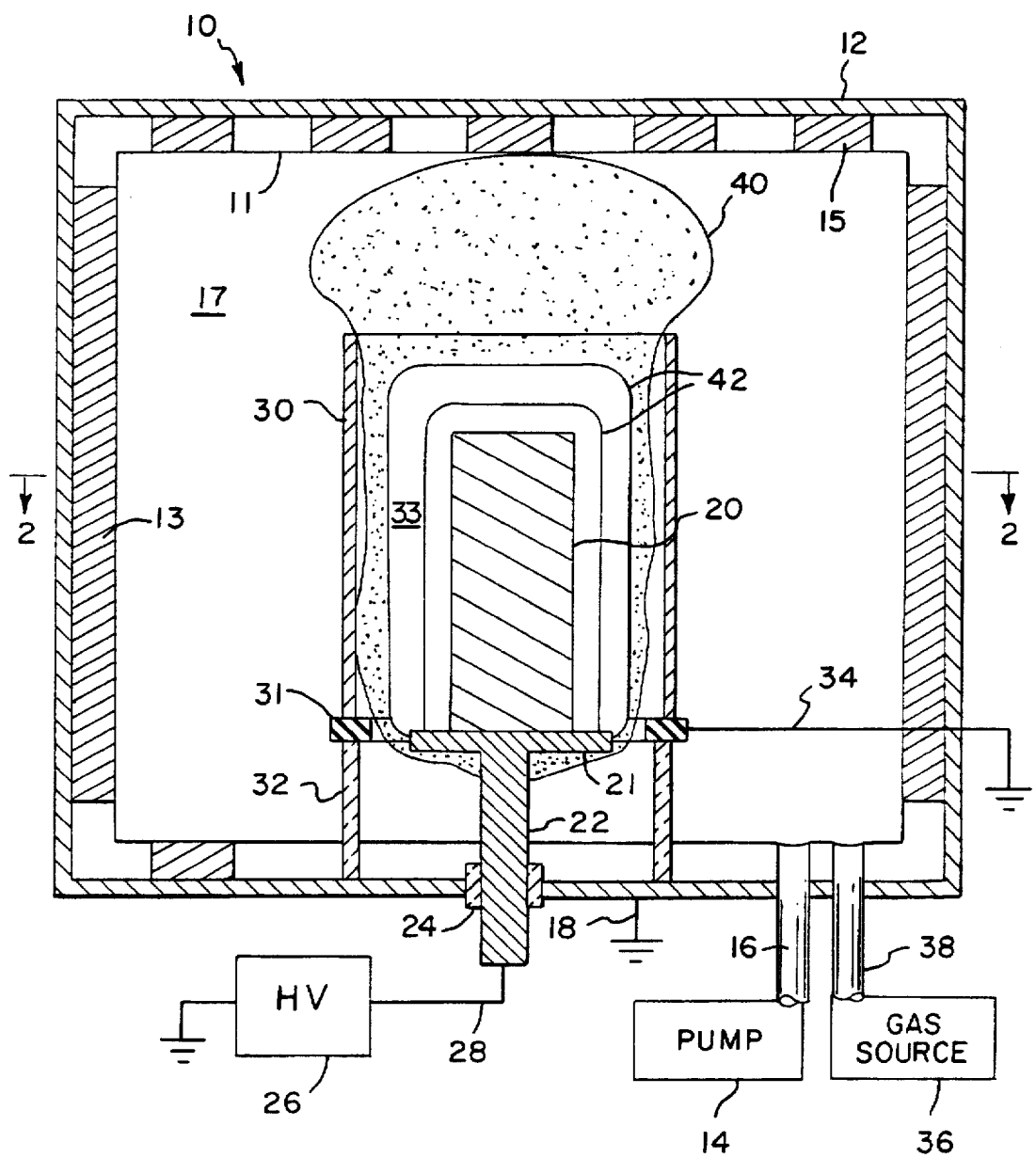
FIG. 1 is a simplified cross-sectional view through an ion implantation chamber with associated apparatus in accordance with the present invention.
Figure 2:
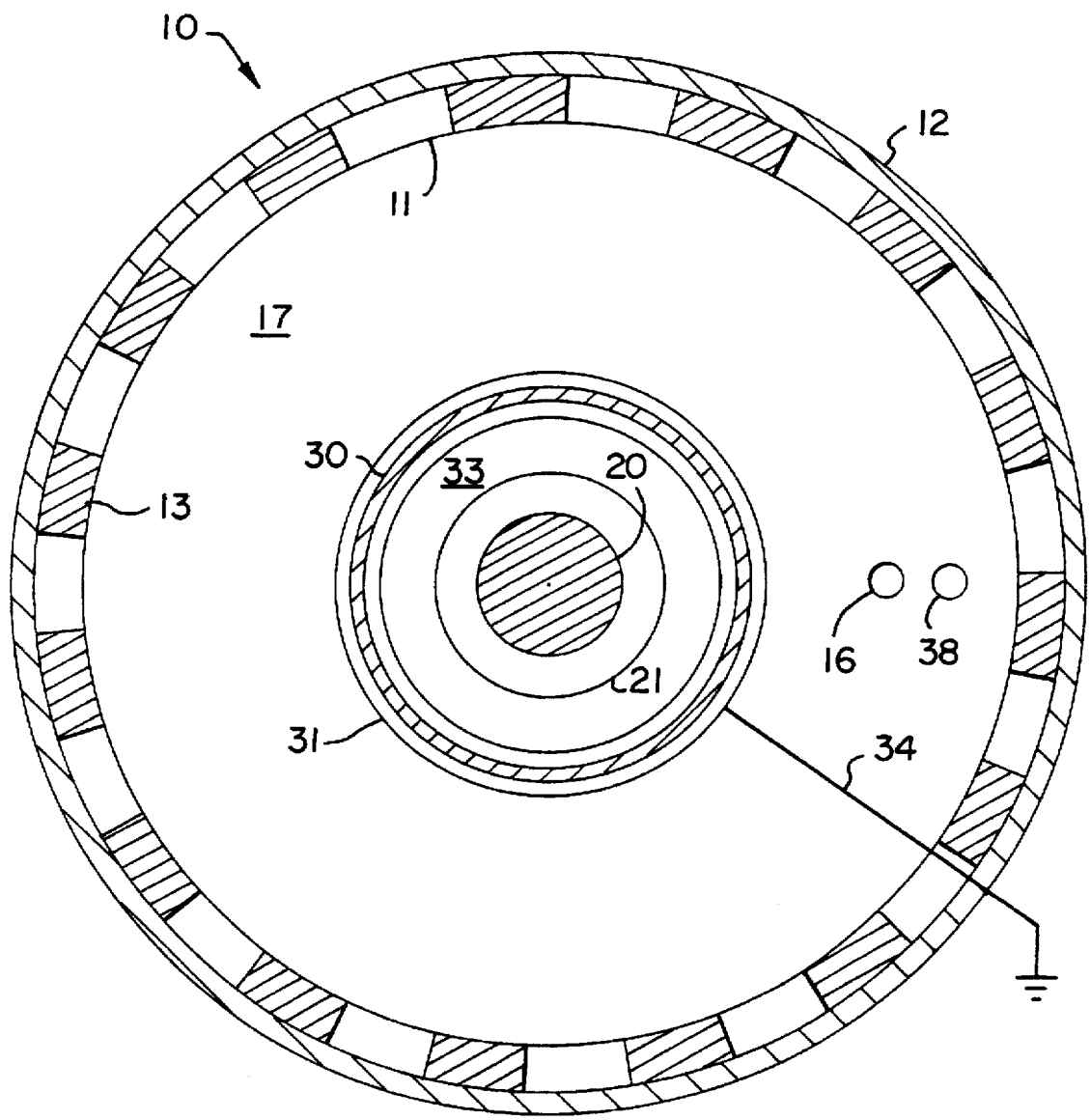
FIG. 2 is a cross-sectional view through the ion implantation chamber of FIG. 1 taken generally along the lines 2—2 of FIG. 1.

With reference to the drawings, an ion implantation apparatus in accordance with the present invention is shown generally at 10, in cross-section, in FIG. 1 and FIG. 2. These figures show the components of the apparatus as configured for the implantation or deposition of the outer surface of a cylindrical target. The apparatus includes an enclosing chamber 12 made, e.g., of stainless steel or aluminum. The walls making up the chamber 12 are preferably electrically connected together and connected by a line 18 to ground. The enclosing chamber 12 may have the standard structural features of a PSII vacuum chamber. A removable stainless steel liner 11 may be placed within the chamber 12 surrounding the interior 17 of the chamber. The liner 11 is electrically connected to the chamber walls 12. The liner 11 is preferably easily removable for cleaning or disposal. Use of a liner 11 reduces the necessity of periodically cleaning the interior of the chamber walls 12, which can become contaminated by stray deposition material. Instead of being deposited on the chamber wall 12, any such material will deposit on the liner 11. A vacuum pump 14 is connected by an exhaust line 16 to the interior 17 of the chamber 12 and operates to evacuate the chamber to a very low base pressure vacuum level (typically on the order of $10^{-6}$ Torr).

Magnetic bars 13 are preferably distributed about the outer periphery of the chamber wall 12, and magnetic pellets 15 are distributed over the top wall of the chamber 12. Adjacent magnetic bars 13 are oppositely poled (i.e., alternating north to south to north, etc.) so that magnetic lines of force run between adjacent magnetic bars within the interior 17 of the chamber. Similarly, adjacent magnetic pellets 15 on the top and bottom walls of the chamber 12 are oppositely poled so that magnetic lines of force run into the chamber between these pellets. The magnetic field thus formed around the interior 17 of the chamber 12 adjacent to the walls of the chamber 12 causes ions to turn around as they approach the wall and move back into the interior 17 of the chamber. Similarly, the magnetic field around the interior 17 of the chamber will cause electrons from an electron source used to ionize a gas in the chamber 17 to turn around as they approach the wall and move back into the interior 17 of the chamber, where they may collide with gas atoms or molecules to ionize the gas. The magnets 13 and 15 may be located between the chamber wall 12 and the liner 11, as shown, or on the exterior of the chamber walls 12. The use of the liner 11 and magnets 13 and 15 is typical for PSII vacuum chambers in general, and may be applied to the present invention. However, since, as described below, for the present invention the ionized gas is separately contained, and may be separately generated, within a cylindrical electrode or a cylindrical target, there is less need for either the liner 11 or the magnets 13 and 15.

A cylindrical target 20 is mounted in the chamber 12, on a conducting stage 21, at the end of a conducting support arm 22. The target 20 may be clamped, or is otherwise secured, to the stage 21. The target cylinder 20 may be placed on and removed from the stage 21 through a door (not shown) formed in a conventional fashion in the enclosure wall 12 which, when closed, seals airtight to the wall and is also electrically connected to the walls to be at the same potential as the walls. The arm 22 holds the target cylinder 20 in a fixed position and is electrically in contact with it through the stage 21. The arm 22, and portions of the stage 21, may be covered with electrical insulation, if desired, or otherwise shielded so that ions are not attracted to the arm 22 or exposed portions of the stage 21. The conductive support arm 22 is electrically isolated, by an insulator 24, from the conductive wall of the chamber 12 through which it passes. The insulator 24 may preferably be made of a ceramic material which is formed to provide an airtight seal to the wall of the chamber 12. A high voltage pulse power supply 26 is used to provide high voltage through a supply line 28 to the conductive support arm 22. The supply 26 is capable of providing repetitive pulses of high voltage, e.g., in the 5 kilovolt to 100 kilovolt range, for a selected duration. For example, the high voltage supply 26 may be of the pulse line-pulse transformer type providing pulse lengths in the range of a few microseconds, or the supply 26 may be chosen from various types of high voltage tube modulated pulsers capable of providing relatively long pulse lengths in the millisecond range or longer.

A cylindrical electrode 30 is enclosed in the chamber 12 along with the cylindrical target 20. This electrode tube 30 is made of a conducting material, e.g., aluminum, and is positioned around the target cylinder coaxially to that cylinder. The Closer to an exact coaxial relationship with which the electrode 30 and the cylinder 20 may be aligned the more uniform will be the resulting implantation or deposition on the surface of the target cylinder 20. No rotation or other mechanical manipulation of the target or electrode is required. The electrode tube 30 rests on a conducting shelf 31 which is separated from the chamber wall 12 by an insulating shelf support 32. The electrode 30 is clamped, or otherwise secured, to the shelf 31. The electrode shelf 31 may be a metal ring which is placed on top of a portion of a glass tube which provides the insulating support 32. The support 32 provides electrical isolation between the electrode tube 30 and the chamber wall 12. The conducting shelf 31 is connected by a line 34, such as a wire, to a point outside of the chamber 12 where it is connected to ground, or to the chamber walls 12, which are themselves grounded. The relative heights of the stage 21 and shelf 31, and lengths of the target 20 with respect to the electrode 30, may be adjusted as necessary. Moreover, although FIG. 2 shows the target 20 and electrode 30 mounted coaxially with the walls of a cylindrical enclosing vacuum chamber 12, the target/electrode pair may be mounted anywhere in the chamber in any orientation with respect to the chamber walls.

In accordance with the present invention, an ionized plasma 40 is developed in the bore of the electrode tube in the space 33 between the target cylinder 20 and the electrode tube 30. The plasma 40 surrounds the target cylinder 20 within this space 33 so that ions may be accelerated into the target cylinder's surface uniformly from all directions. Any ambient material to be ionized may be admitted into the chamber 17. To develop the surrounding plasma, where a gas is to be used as the material to be implanted, a gas source 36 is connected by a line 38 to leak the gas at a low, controlled, rate into the chamber 17 as the chamber 17 is being evacuated by the vacuum pump 14. Prior to ionization, there thus will be a low pressure atmosphere of the gas from the gas source 36 within the chamber 12, and within the space 33 between the electrode 30 and the target 20, mixed with very low levels of other impurity gasses such as oxygen, etc. The ionizing ambient may also be provided using other well known techniques, including sources provided by the vaporization of liquids and solids to form the ambient gas.

The neutral gas located within the bore of the electrode 30 may be ionized in various ways, including by electron impact, glow discharge, and radio frequency (rf) techniques. In the electron impact method, a filament is heated to a emit electrons which collide with the gas atoms and strip atomic electrons, resulting in a plasma. A preferred method for plasma generation for the embodiment of the invention shown in FIG. 1 is the glow discharge method. In the glow discharge method a high neutral gas pressure (0.1–200 mTorr) is present in the chamber 17 and the space 33 between the target 20 and the electrode 30. High voltage pulses applied to the target 20 from the high voltage power supply 26 ionize the atoms of the gas into a plasma 40. The ionization process is established due to energetic secondary electrons emitted from the surface of the target 20. Although the ionization cross section is low for such high energy electrons, the high neutral gas pressure results in significant ionization. The glow discharge characteristics depend on the target material, applied voltage, pulse width, pulse frequency, and the density of the neutral gas.

When a large negative potential pulse is applied to the target 20, which is now surrounded by the plasma 40, plasma sheaths 42 form around the target. The plasma sheaths 42 are regions, between the quasi-charge neutral plasma 40 and an electrode, in this case the target 20, in which charge neutrality is violated. Just prior to the application of a negative voltage pulse the target is at zero potential. As the voltage pulse is applied to the target 20, and the potential of the target increases to the maximum negative potential with respect to the electrode 30, electrons are expelled from a region near the target. This expulsion occurs rapidly, on a time scale governed by the inverse electron plasma frequency. During this initial expulsion of electrons, the much heavier ions experience negligible motion so that, as the electrons are repulsed, they leave behind a region of nearly uniform ion space charge. Such a region is the plasma sheath 42. Multiple sheath regions 42 may occur, each having a different, but nearly uniform, ion space charge. If this process is observed, such as through a window in the chamber wall 12 (not shown) it may be observed that each plasma sheath 42 may be of a different color.

Later on during the application of the voltage pulse to the target 20, on a slower time scale governed by the inverse ion plasma frequency, ions are accelerated toward the target 20 as they fall through the sheaths 42. The ions impact the outer surface of the cylindrical target 20 at an angle normal to the surface and are thereby implanted into, or deposited onto, that surface. The normal angle of impact reduces sputtering from the target surface. The level of voltage differential between the target 20 and electrode 30 determines whether ions will be implanted or deposited. At higher voltage differentials the ions achieve sufficient energy to be implanted below the surface of the target 20. The use of the cylindrical electrode 30 acts to contain a uniform plasma density around the surface of the target, thereby enhancing the uniformity of the implantation or deposition. The electrode 30 also acts to contain the plasma 40, thereby preventing the inadvertent deposition of ions onto the inner surface of the vacuum chamber 12 or liner 11 which can be a particular problem for either depositing a DLC coating on a target or depositing a sputtered metal onto a target surface.

The embodiment of the invention depicted in FIG. 1 can also be configured to implant or deposit on the inner surface of a cylinder. In this case the functions of the target material 20 and the electrode 30 are reversed. For example, to deposit on the inner bore surface of a cylindrical tube, the target tube section is placed in the position of the electrode 30, and a cylindrical electrode is placed in the position of the target 20 in FIG. 1. The plasma is generated between the target and the electrode in the same manner as described above with, however, the high voltage source 26 applied on the line 34 to what is now the target at 30. Similarly, the line 28 is connected to ground, thereby grounding what is now the electrode at 20. As high voltage negative pulses are applied to the target, now at 30, plasma sheaths 42 will form around the inner bore surface of the target tube. Ions accelerated through the plasma sheath will impact the inside surface of the target tube at an angle normal thereto, thereby implanting or depositing uniformly along the inner surface of the tube. Once again, the tube 30, in this case the target, helps to contain the plasma 40 so as to prevent unwanted deposition on the inner surface of the vacuum chamber 12 or liner 11. An example of the use of this method and configuration to deposit a DLC coating on the inner surface of a metal tube is described below.

A second configuration and application of the present invention is described with reference to FIG. 3. Elements in this figure which are analogous to elements in FIG. 1 are labeled with the same reference numeral as in FIG. 1. This figure shows the apparatus of the present invention configured in a manner to perform ion assisted deposition of a sputtered material onto the inner bore surface of a cylindrical target 50. In this figure the target 50 and electrode 56 are shown in perspective, mounted inside of the PSII vacuum chamber 12. The chamber 12 may be provided with a liner and magnets as shown in FIG. 1, however, as mentioned above, these are less useful in the application of the method of the present invention than for PSII processes in general.

In this configuration the target tube 50 is supported in the chamber 12 by insulating supports 52 which may be of a material such as glass or ceramic. Though not in direct contact with the conducting stand 21, the target 50 is electrically connected to the high voltage source 26 through the stand 21 by a conductor such as a wire 54 which is attached to the outer surface of the target 50. An electrode 56 is suspended so as to be coaxially aligned within the target tube 50. The length of the electrode 56 may be longer than that of the target 50, as shown. The electrode 56 is separated from the conductive walls of the chamber 12 by insulating supports 58. The electrode 56 is electrically connected through the chamber wall by a line 60 to a power supply, such as a radio frequency (rf) voltage source 62. The line 60 is attached to an aluminum rod 61 which is electrically isolated from the chamber wall 12, through which it passes, by insulating conduits 59, such as of glass, which also preserve the integrity of the vacuum chamber 12. The rod 61 is then attached to the electrode 56.

In accordance with the present invention, ion assisted deposition on the inner bore surface of a target cylinder 50 is achieved where the electrode 56 is a cathode made of the metal to be deposited. The cathode 56 is made to extend from either end of the target tube 50 to minimize edge effects, thus improving the uniformity of deposition along the length of the inner bore surface of the target 50. As was described above, a gas to be ionized is admitted to the chamber 17, which has been evacuated by the pump 14, from a gas source 36. This gas enters the space 33 between the target 50 and electrode 56. For this application, an rf technique is preferable for generating a plasma from the neutral gas in the space 33. This is achieved by applying the radio frequency (rf) voltage source 62 to the cathode 56 via a tunable matching network (not shown). The oscillating rf waves generate the plasma by stripping the gas atoms of electrons. Ions from the plasma are accelerated toward the cathode 56, sputtering metal from the cathode surface which is, in turn, drawn to the target surface by a high voltage pulse which is applied to the target 50 from the voltage source 26. The sputtered material is thereby deposited on the inner surface of the target tube 50. Since the sputtering and deposition are largely contained within the space 33 between the target 50 and cathode 56, unintended deposition onto the chamber wall 12 is reduced. A more detailed example of the use of this configuration for ion assisted deposition of a sputtered material is described below.

This same procedure may be used for ion assisted deposition on the outer surface of a cylindrical target. In such a case a tube shaped cathode of the material to be sputtered replaces the target tube at 50, and the cylindrical target replaces the cathode at 56. Preferably, the cathode tube is then longer than the target cylinder to minimize edge effects. Also, the rf source 62 is now applied to the cathode tube at 50 instead of to the center cylinder which is now the target at 56. Switches, not shown, may be used to switch the target and electrode between the rf source 62 and high voltage source 26.

Ion assisted deposition on cylindrical surfaces may be accomplished in accordance with the present invention using a variety of sputtering materials and plasma gasses. Pure metal, alloy, or metallic compound coatings may be achieved depending upon the composition of the cathode and plasma gas which is used.

Ion assisted deposition can also be accomplished using the configuration shown in FIG. 1. For example, to deposit a metal on the outer surface of the cylindrical target 20, an rf voltage source may be applied to a sputter cathode electrode at 30 through the line 34. Similarly, the configuration shown in FIG. 3 may be used to apply DLC coatings to a cylindrical surface or implant ions into a cylindrical surface. FIG. 1 and FIG. 3 are only exemplary configurations for the present invention, and should generally be considered interchangeable. Other configurations of the components of a PSII system may be used which are in accordance with the present invention. Of particular significance in the present invention, however, is the coaxial and conformal (one inside the other) relationship of the electrode and target cylinders.

Examples: DLC Coating

DLC coatings are characterized by extremely high hardness, low friction, and chemical inertness. A DLC coating was applied to the outer surface of a cylindrical target by a method in accordance with the present invention using the configuration shown in FIG. 1. An aluminum cylinder tube approximately to centimeters in length and 8.8 centimeters in inside diameter was used as the target. The target was placed on a conducting stage 21 in an enclosing chamber 12. A cylindrical aluminum electrode tube was placed around the target 20 on the conducting stage 31 in the chamber 12 and was positioned to be coaxial to the target 20. The distance between the outer surface of the target 20 and the inner bore surface of the electrode tube 30 was 2.9 centimeters. For better adherence of the coating to the target surface the surface was first cleaned ultrasonically with acetone. Additionally, the target surface was sputter cleaned to remove any oxide layers. This sputter cleaning may be accomplished inside the chamber, with the target and the electrode cylinders in place, by any method commonly known in the art. For the example being described, an argon gas was admitted into the evacuated chamber 17 to a pressure of 100 mTorr. Other inert gases, such as krypton or xenon, or chemically active gases, such as fluorine or chlorine-based gases, may also be used for this cleaning step. A voltage pulse of 1 kV and 45 microsecond duration at a repetition rate of 100 Hz was then applied to the target resulting in a sputtering dose of $2\times10^{17}$ ions per cubic centimeter. The sputter cleaning proceeded for approximately 20 minutes.

Figure 4:
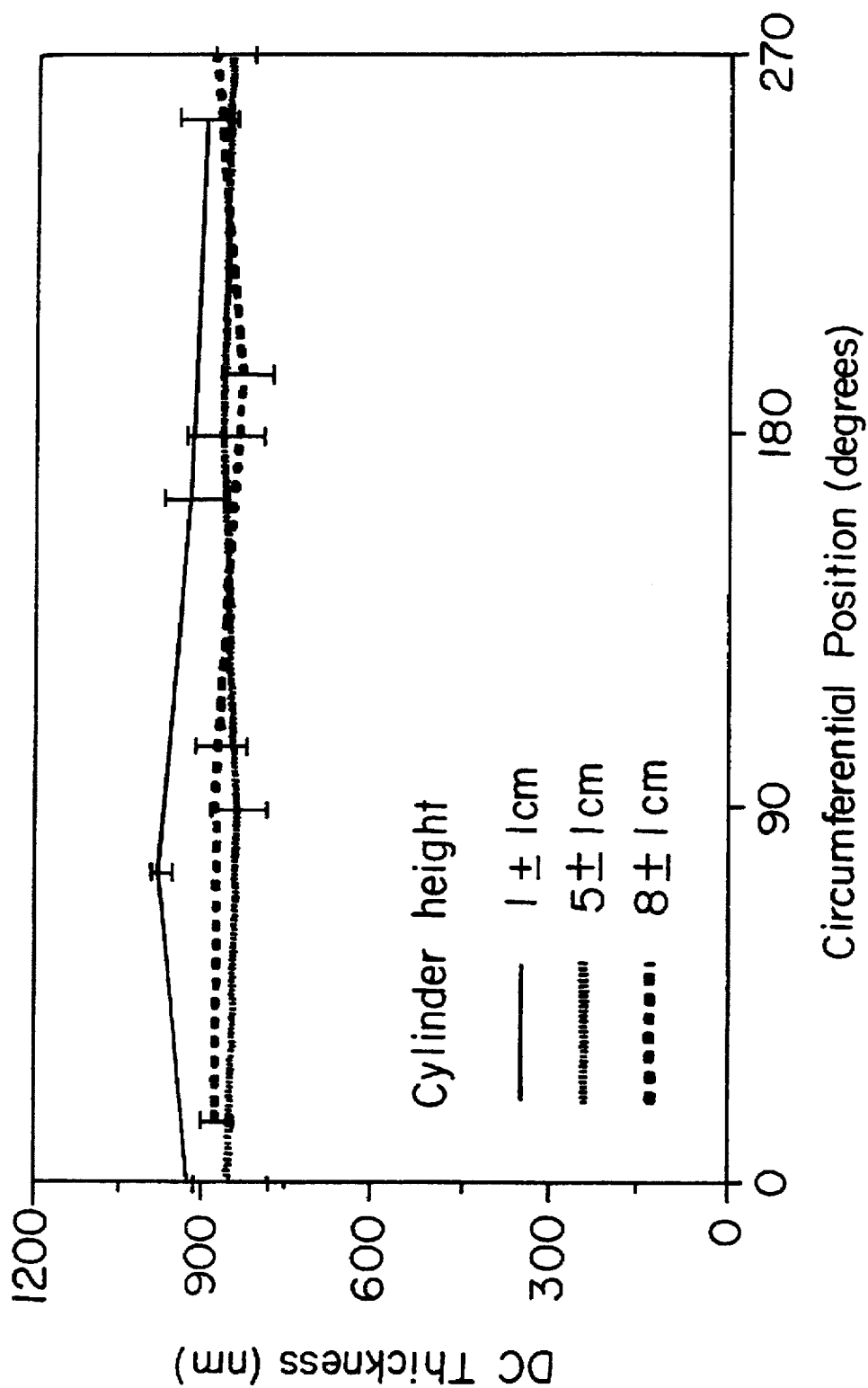
FIG. 4 is a graph showing deposition thickness of a diamond like carbon (DLC) coating on the outer surface of a cylinder treated in accordance with the present invention with respect to position along the height and circumference of the cylinder.

After the inside 17 of the enclosing chamber 12 was re-evacuated, an acetylene gas was admitted to the chamber 17 at a pressure of approximately 50 mTorr. Other hydrocarbon gases such as methane, ethylene, or butane may also be used. This gas was ionized to produce the ions for the DLC coating by means of the glow discharge technique. A high voltage signal, having a peak magnitude of approximately 4 kilovolts, and a pulse width of 45 microseconds at 100 Hz, was applied to the target for 120 minutes. This resulted in a uniform DLC film of approximately 900 nm thickness on the outer surface of the target 20. The coating was nearly uniform both with respect to circumferential position on the cylindrical surface of the target 20 and along the height (or length) of the target 20, as shown in FIG. 4.

Figure 3:
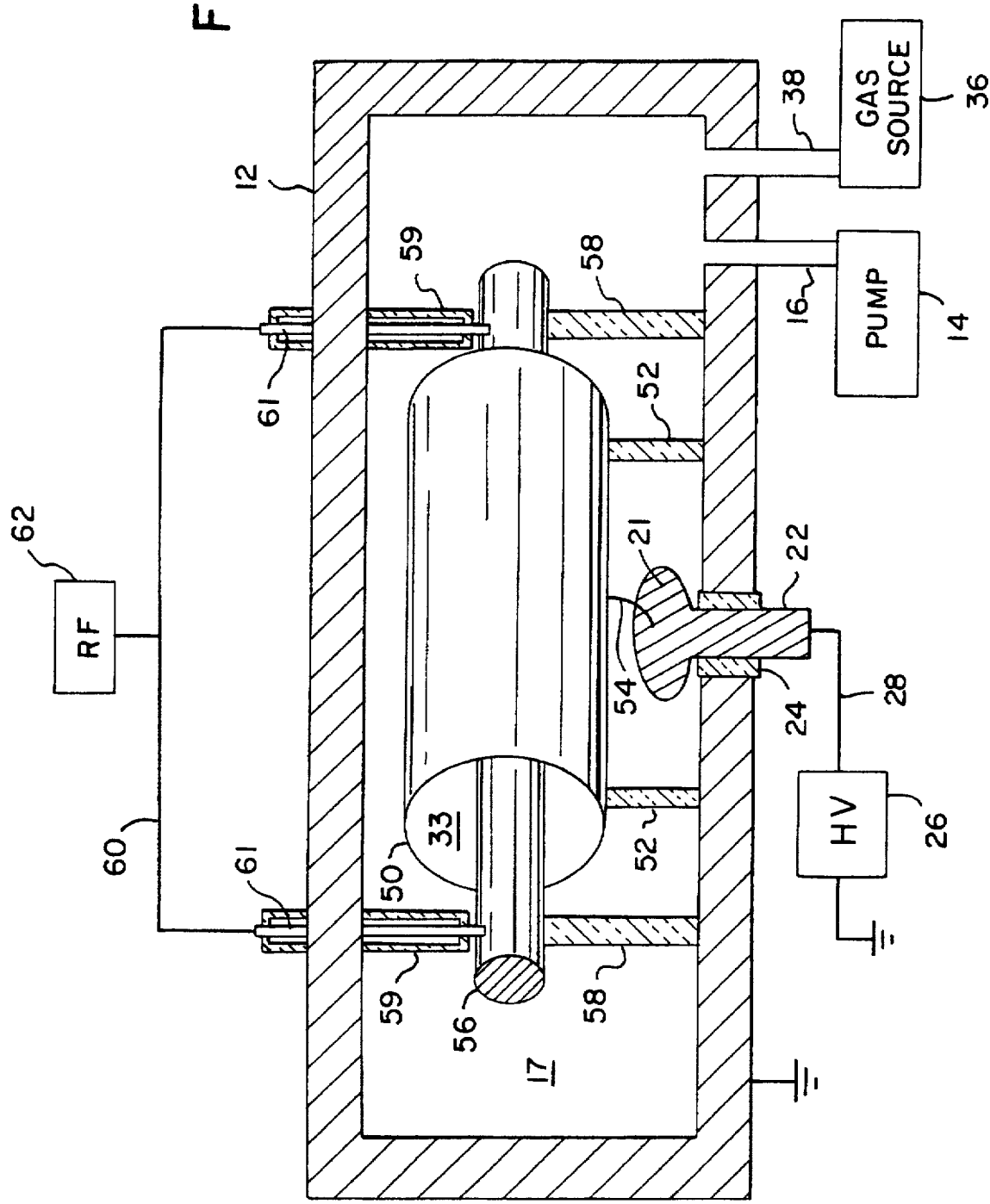
FIG. 3 is a simplified cross-sectional view through an ion implantation chamber showing a second embodiment of the present invention in partial perspective for illustrative purposes.

A variation of this procedure was used to apply a DLC coating to the inner bore surface of a target tube 50 using the configuration shown in FIG. 3. In this case, a steel tube approximately 50 centimeters in length and 8.9 centimeters in insider diameter was used as the target tube 50. The target tube 50 was supported in the enclosing chamber 12 on insulating supports 52. A cylindrical steel electrode 56 was placed inside the target tube 50, on insulating supports 58, and positioned to be approximately coaxial to the target tube 50. The distance between the outer surface of the inner electrode 56 and the inner bore surface of the target tube 50 was 3.65 centimeters. The inside of the target tube 50 was cleaned and de-oxidized by sputter cleaning, as described above. After the cleaning and re-evacuation of the inside 17 of the enclosing chamber 12, an acetylene gas was admitted to the chamber 17 at a pressure of approximately 75 mTorr. This high density gas was ionized to produce the ions for the DLC coating by means of the glow discharge technique. A high voltage signal, having a peak magnitude of approximately 1 kV and a pulse width of 75 microseconds at 100 Hz, was applied to the target for 75 minutes. This resulted in a nearly uniform DLC film of approximately 900 nm thickness on the inner surface of the target tube 50.

Figure 5:
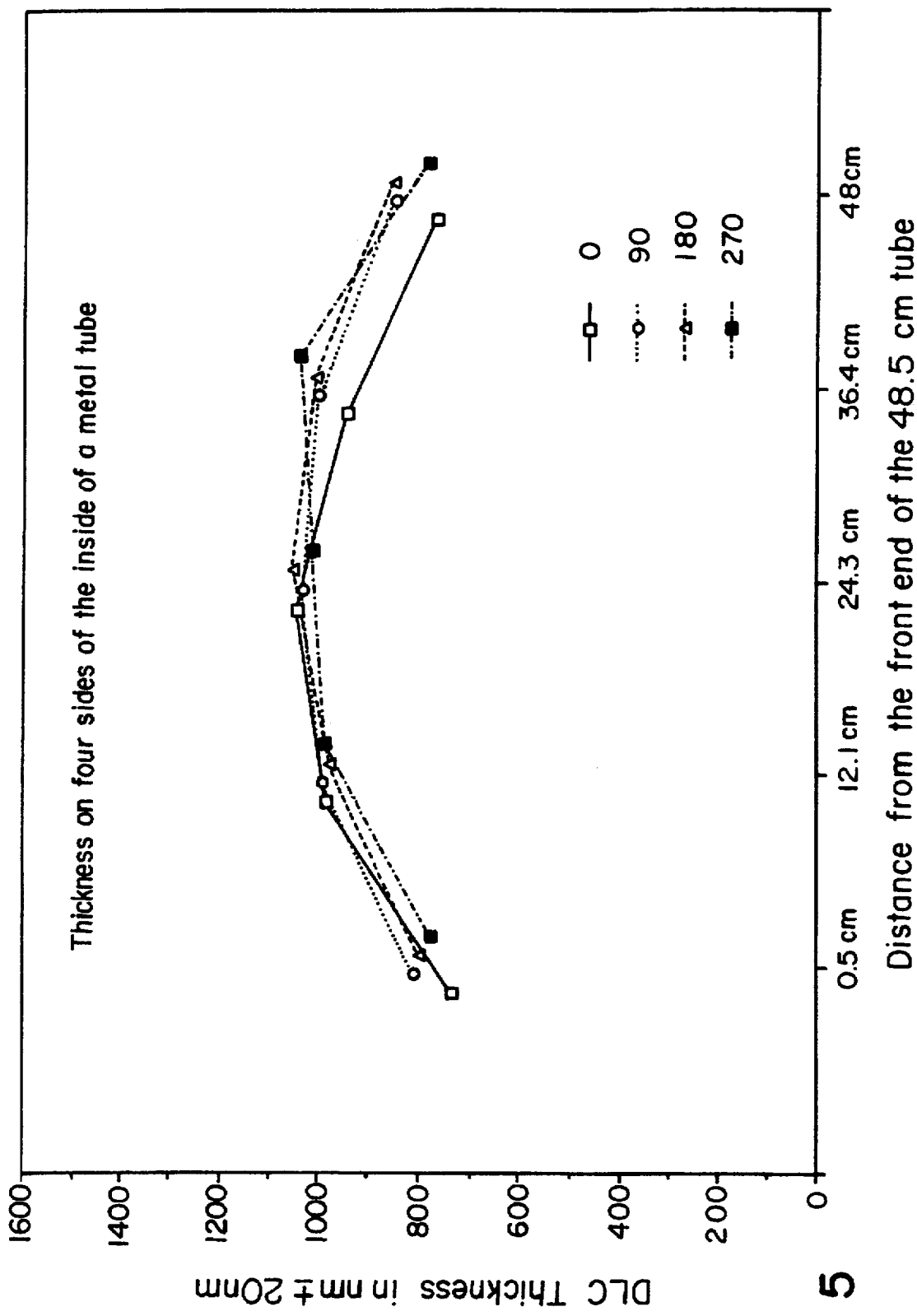
FIG. 5 is a graph showing deposition thickness of a DLC coating on the inner bore surface of a tube treated in accordance with the present invention with respect to position along the length and circumference of the tube.

The result of the deposition process was measured by placing small silicone samples, called coupons, along the inner surface of the target tube prior to the deposition process. The coupons were removed after the deposition process was completed to examine the amount of coating deposited thereon. The amount of coating deposited on the inside of the tube was thereby determined without having to actually cut the tube into many small pieces. The resulting DLC deposition thickness, with respect to circumferential position on the inner bore surface of the target tube 50 and distance from one end of the tube (along the tube length), is plotted in FIG. 5. Due to edge effects resulting from a drop in the uniformity of the plasma near the ends of the tube, a slight decrease in the thickness in the DLC coating was noticed at the ends of the target tube. Problems resulting from this slight deviation in uniformity along the axial dimension of the inside of the tube 50 can be avoided by using sacrificial ends on the target tube which can be removed after the deposition process is complete.

For certain applications it may be desirable to increase the binding of the DLC coating to either the inner bore surface or the outer surface of the target cylinder. This may be done by first implanting the deposition material into the target surface and then depositing normally as described above. The implanting step may be achieved, for example, by increasing the peak voltage level applied to the target to approximately 25 kV for the desired implantation period.

Examples: Ion Assisted Deposition

Figure 6:
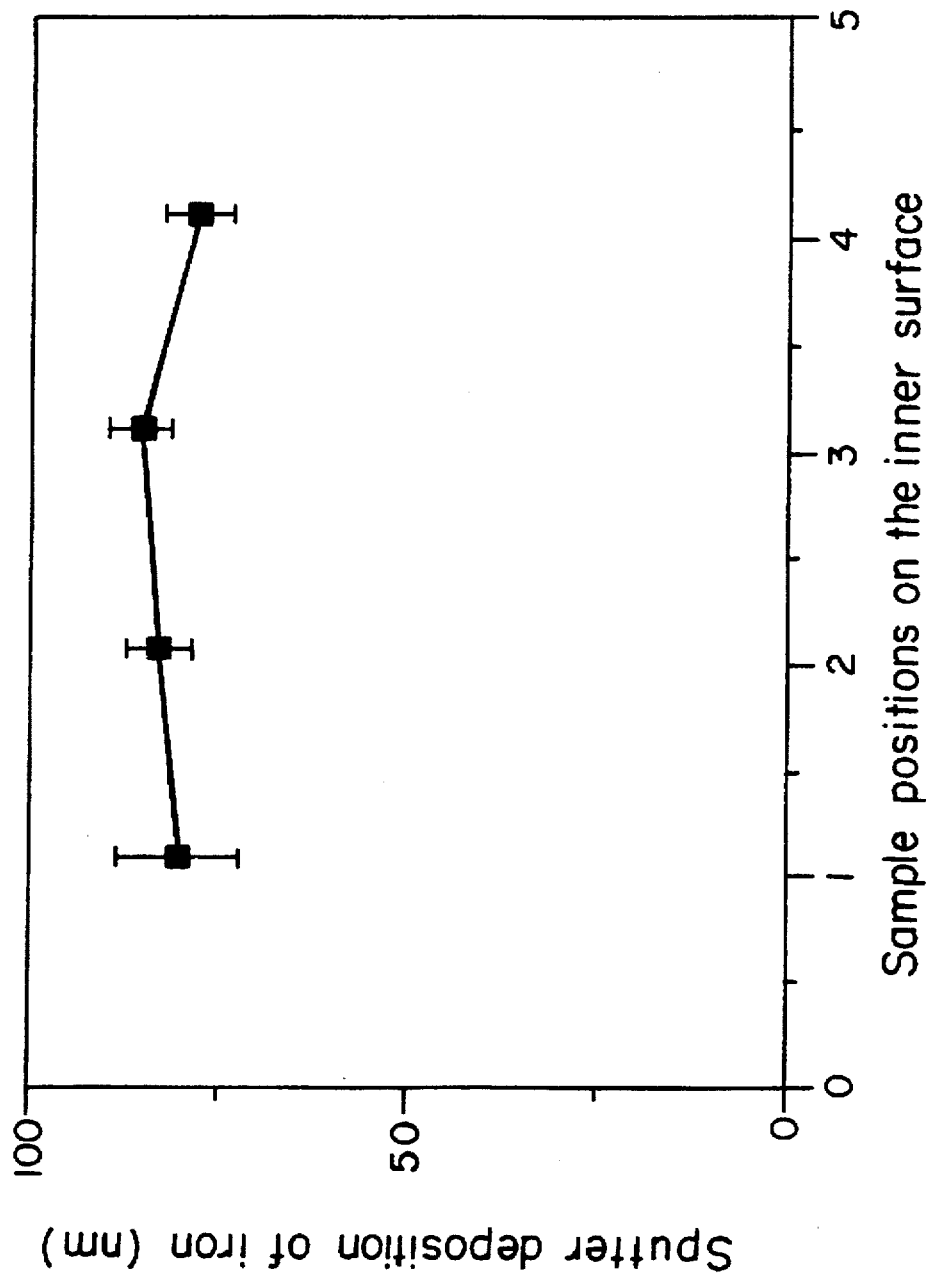
FIG. 6 is a graph showing deposition thickness of a sputtered deposition of iron on the inner bore surface of a tube treated in accordance with the present invention with respect to sample positions along the length of the tube.

In this case the target 50 was an iron tube approximately 60 centimeters long and 8 centimeters in diameter. The configuration of FIG. 3 was employed. For the sputtering cathode electrode 56 an iron rod 1.6 centimeters in diameter was centered coaxially inside of the target tube. Another deposition of titanium using a titanium bar for the cathode was also performed in a similar manner as described below. The inside of the target tube 50 was cleaned and deoxidized using argon sputter cleaning as described above. After cleaning and re-evacuation, an argon gas was admitted to the inside 17 of the enclosing chamber 12 to a pressure of 10 mTorr. The sputter cathode was self-biased at approximately 400–500 V and a 13.56 MHz rf voltage source of 500 Watts was applied to the cathode 56 from the rf power supply 62, via a tuneable matching network (not shown) to generate a plasma from the argon gas using the rf plasma generation technique. Argon ions, which were accelerated toward the cathode 56, sputtered metal from the cathode 56. The sputtered material was, in turn, drawn to the target 50 by a high voltage pulse having a peak magnitude of 1 kV, and a pulse width of 75 microseconds at 100 Hz which was applied to the target 50, and deposited on the inner surface of the target tube 50. The sputter deposition proceeded for 90 minutes, resulting in a nearly uniform sputter deposition of iron of approximately 90 nm thickness on the inner surface of the target tube 50 as shown in FIG. 6. Since the sputtering and deposition processes were largely contained within the space 33 between the target 50 and the cathode 56, unintended deposition unto the chamber wall 12 was reduced.

The exemplary applications for DLC coating and ion assisted deposition as described above are not considered to limit the scope of the present invention. The present invention may be utilized for a variety of implantation and deposition operations based on the basic PSII process described in U.S. Pat. No. 4,764,394, the disclosure of which is incorporated herein by reference. A variety of materials for the target, the plasma, and any sputtering material may be used. For example, besides the deposition of carbon from hydrocarbon gas plasmas, the present invention may be used to uniformly deposit other species onto cylindrical surfaces. Organometallic species, such as tungsten from tungsten hexafluoride, titanium from titanium tetrafluoride, silicon from silane, and boron from boron trifluoride, may be deposited using the present invention. Operating parameters, such as the composition and pressure of the plasma gas, the voltage levels to be applied to the target or system electrodes, and the duration of the implantation or the deposition process, will vary depending on the implantation or deposition result which is desired and the materials used. A calibration run may preferably be made, for example, to determine how much time is needed for a desired level of deposition or implantation or for calibrating any of the other operating parameters.

Batch Processing

Figure 7:
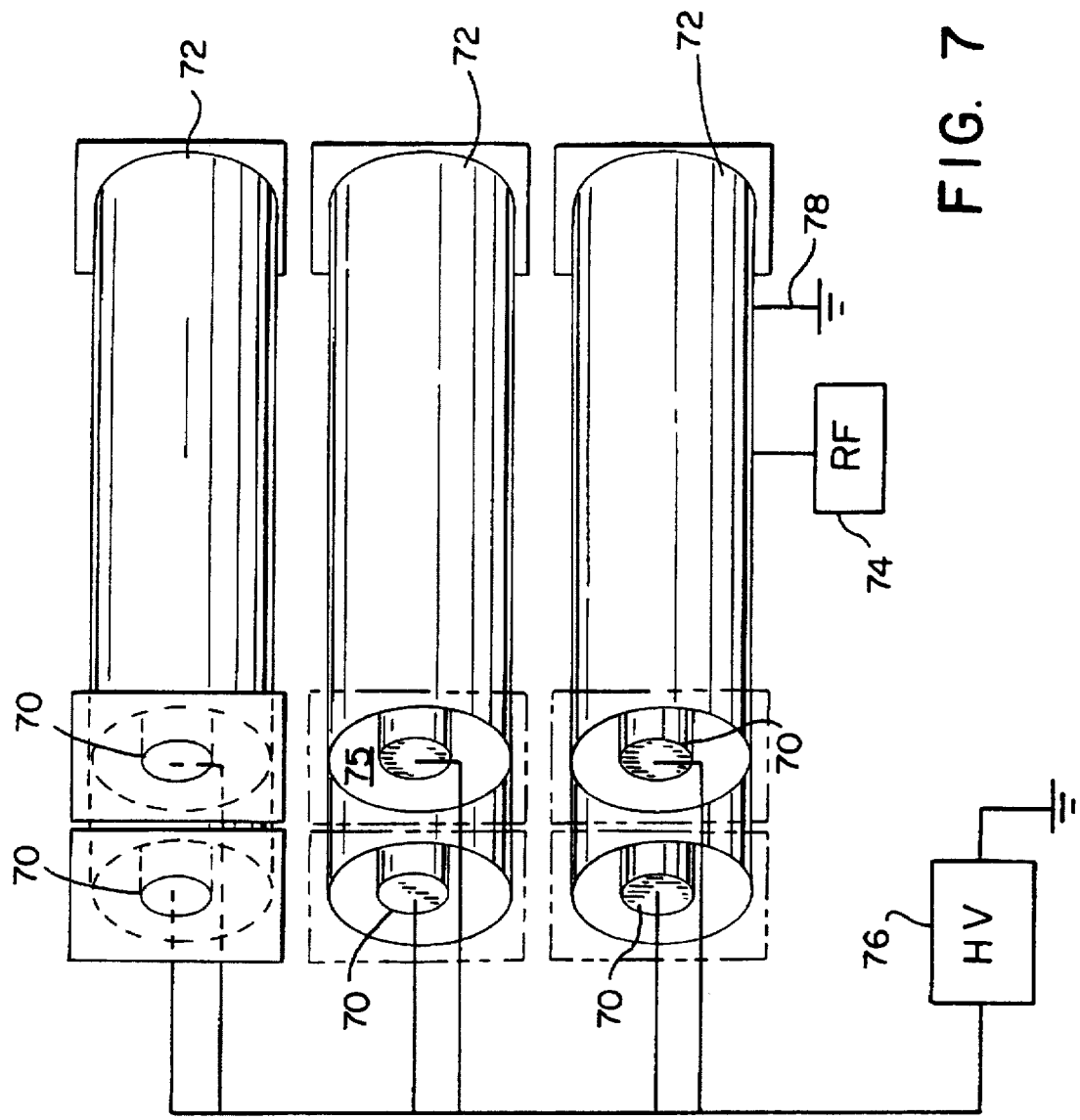
FIG. 7 is a perspective view of the contents of an ion implantation chamber as arranged for batch processing in accordance with the present invention.

The present invention is particularly suited to upscaling for batch process implantation or deposition. For example, a configuration for the ion assisted deposition of the outer surfaces of six target cylinders 70 is shown in FIG. 7. Each of the target cylinders 70 is coaxially aligned inside of a cathode tube 72. The cathode/target pairs are distributed inside of a PSII vacuum chamber (not shown in FIG. 7). An rf voltage source 74, connected to each of the cathodes 72, is used to generate a plasma from an ambient gas in the spaces 75 between the targets 70 and the cathodes 72, as described above. Alternatively, this configuration can be used for implantation, or deposition of a DLC coating, by applying a high voltage pulse waveform from a high voltage source 76 to the targets 70 and by connecting the electrodes 72 to ground 78. The connections shown between the electrodes 72 and the rf voltage source 74 and ground 78 are alternatives, and may be switched as appropriate. In either case, each coaxial cylinder pair acts as its own plasma generating source, independent of the other similar arrangements within the same chamber. As a consequence, each target 70 and electrode 72 receives the same exposure to a uniform plasma, resulting in a predictable and uniform coating on each target 70 with respect to the other targets. Since the plasma is relatively confined within each pair, deposition ions from one target/electrode combination will be less likely to contaminate other combinations or the vacuum chamber walls. By reversing the connections described above, of course, a similar configuration can be used for batch implantation or deposition of the inner bore surface of a cylindrical target. Production using the present invention can also be scaled up by replacing a single target cylinder with a combination of cylindrical components in series within or around a single electrode tube, each target cylinder being coaxial with the electrode. These components may, for example, be of varying diameters. As long as each component is coaxial with the electrode, uniform deposition or implantation of each component will be achieved. The easy scale-up and predictable results of batch processing cylindrical products by use of the present invention is a particular advantage of the invention.

It is understood that the term cylindrical, as used in this disclosure, is meant to include all objects which are generally, or approximately, cylindrical, or tubular in shape. Similarly, the term coaxial is meant to include all positions of one cylindrical object with respect to another which are generally, or approximately, coaxial.

It is further understood that the present invention is not limited to the particular embodiments set forth herein as illustrative, but embraces all such modified forms thereof as come within the scope of the following claims.

What is claimed is:

1. A method for treating a cylindrical surface with a material, comprising the steps of:
   (a) positioning a target cylinder in an enclosing chamber;
   (b) positioning an electrode cylinder in the enclosing chamber in a coaxial and conformal relation to the target cylinder to define a space between an inner bore surface of a one of the target cylinder or the electrode cylinder and an outer surface of the other of the target cylinder or the electrode cylinder;
   (c) generating a plasma of ions in the space between the inner bore surface and the outer surface; and
   (d) treating a one of the inner bore surface or the outer surface with a material by applying a voltage differential in a pulse between the target cylinder and the electrode cylinder to accelerate the ions in the plasma toward one of the inner bore surface or the outer surface at an ion energy sufficient to impact the one of the inner bore surface or outer surface.

2. The method of claim 1 wherein the step of generating the plasma comprises generating a plasma by use of a glow discharge technique.

3. The method of claim 1 wherein the treating step includes the step of applying the voltage pulse differential to accelerate the ions to an ion energy sufficient to implant ions impacting the one of the inner bore surface or the outer surface beneath the one of the inner bore surface or the outer surface.

4. The method of claim 1 wherein the treating step includes the step of applying the voltage pulse differential to accelerate the ions to an ion energy sufficient to deposit ions impacting the one of the inner bore surface or outer surface onto the one of the inner bore surface or outer surface.

5. The method of claim 4 wherein the ions deposited on the one of the inner bore surface or outer surface form a diamond like carbon coating on the one of the inner bore surface or outer surface.

6. The method of claim 1 wherein the electrode cylinder is a cathode made of a material to be deposited by sputtering onto the target.

7. The method of claim 6 wherein the step of generating the plasma comprises the step of applying a radio frequency voltage source to the electrode cylinder.

8. A method for treating a cylindrical surface with ions, comprising the steps of:
   (a) positioning a target cylinder in an enclosing chamber;
   (b) positioning an electrode cylinder in the enclosing chamber around an outer surface of the target cylinder and in a coaxial relation to the target cylinder;
   (c) generating a plasma of ions in a space between the outer surface of the target cylinder and an inner bore surface of the electrode cylinder; and
   (d) treating the outer surface of the target cylinder with ions by applying a voltage differential in a pulse between the target cylinder and the electrode cylinder to accelerate the ions in the plasma toward the outer surface of the target at an ion energy sufficient to impact the outer surface of the target cylinder.

9. The method of claim 8 wherein the step of generating the plasma comprises generating a plasma by use of a glow discharge technique.

10. The method of claim 8 wherein the treating step includes the step of applying the voltage pulse differential to accelerate the ions to an ion energy sufficient to implant ions impacting the outer surface of the target beneath the outer surface of the target.

11. The method of claim 8 wherein the treating step includes the step of applying the voltage pulse differential to accelerate the ions to an ion energy sufficient to deposit ions impacting the outer surface of the target cylinder onto the outer surface of the target.

12. The method of claim 11 wherein the ions deposited on the outer surface of the target form a diamond like carbon coating on the outer surface of the target.

13. The method of claim 12 wherein the step of generating the plasma of ions includes the steps of admitting a hydrocarbon gas selected from the group consisting of acetylene, methane, ethylene, and butane into the enclosing chamber and applying a voltage pulse between the target cylinder and the electrode cylinder to generate the plasma from the hydrocarbon gas by a glow discharge technique.

14. The method of claim 13 including the additional step of sputter cleaning the outer surface of the target cylinder prior to admitting the hydrocarbon gas into the enclosing chamber.

15. The method of claim 14 wherein the step of sputter cleaning the outer surface of the target includes the steps of admitting an inert gas selected from the group consisting of argon, krypton, and xenon into the enclosing chamber and applying a voltage pulse between the target cylinder and the electrode cylinder.

16. A method for treating a cylindrical surface with ions, comprising the steps of:
   (a) positioning a target cylinder in an enclosing chamber;
   (b) positioning an electrode cylinder in the enclosing chamber inside an inner bore surface of the target cylinder and in a coaxial relation to the target cylinder;
   (c) generating a plasma of ions in a space between the inner bore surface of the target cylinder and an outer surface of the electrode cylinder; and
   (d) treating the inner bore surface of the target cylinder with ions by applying a voltage differential in a pulse between the target cylinder and the electrode cylinder to accelerate ions toward the inner bore surface of the target cylinder from the plasma at an ion energy sufficient to impact the inner bore surface of the target cylinder.

17. The method of claim 16 wherein the step of generating the plasma comprises generating a plasma by use of a glow discharge technique.

18. The method of claim 16 wherein the treating step includes the step of applying the voltage pulse differential to accelerate the ions to an ion energy sufficient to implant ions impacting the inner bore surface of the target cylinder beneath the inner surface of the target cylinder.

19. The method of claim 16 wherein the treating step includes the step of applying the voltage pulse differential to accelerate the ions at an ion energy sufficient to deposit ions impacting the inner bore surface of the target cylinder onto the inner bore surface of the target cylinder.

20. The method of claim 19 wherein the ions deposited on the inner bore surface of the target cylinder form a diamond like carbon coating on the inner surface of the target.

21. The method of claim 20 wherein the step of generating the plasma of ions includes the steps of admitting a hydrocarbon gas selected from the group consisting of acetylene, methane, ethylene, and butane into the enclosing chamber and applying a voltage pulse between the target cylinder and the electrode cylinder to generate the plasma from the hydrocarbon gas by a glow discharge technique.

22. The method of claim 21 including the additional step of sputter cleaning the inner surface of the target prior to admitting the hydrocarbon gas into the enclosing chamber.

23. The method of claim 22 wherein the step of sputter cleaning the inner surface of the target includes the steps of admitting an inert gas selected from the group consisting of argon, krypton and xenon into the enclosing chamber and applying a voltage pulse between the target cylinder and the electrode cylinder.

24. A method for depositing material onto a cylindrical surface, comprising the steps of:
   (a) positioning a target cylinder in an enclosing chamber;
   (b) positioning a cathode cylinder made of a material to be sputtered in the enclosing chamber around an outer surface of the target cylinder and in a coaxial relation to the target cylinder;
   (c) generating a plasma of ions in a space between the outer surface of the target cylinder and an inner bore surface of the cathode cylinder;
   (d) accelerating ions from the plasma toward the inner surface of the cathode cylinder at an ion energy sufficient to sputter material from the inner bore surface of the cathode cylinder; and
   (e) depositing the sputtered material on the outer surface of the target cylinder.

25. The method of claim 24 wherein the step of generating the plasma of ions includes the step of applying a radio frequency voltage source to the cathode cylinder.

26. A method for depositing material onto a cylindrical surface, comprising the steps of:
   (a) positioning a target cylinder in an enclosing chamber;
   (b) positioning a cathode cylinder made of a material to be sputtered inside an inner bore surface of the target cylinder and in a coaxial relation to the target cylinder;
   (c) generating a plasma of ions in a space between the inner bore surface of the target cylinder and an outer surface of the cathode cylinder; and
   (d) accelerating ions from the plasma toward the outer surface of the cathode cylinder at an ion energy sufficient to sputter material from the outer surface of the cathode cylinder; and (e) depositing the sputtered material on the inner bore surface of the target cylinder.

27. The method of claim 26 wherein the step of generating the plasma includes the step of applying a radio frequency voltage source to the cathode cylinder.

28. A method for treating a plurality of cylindrical surfaces with a material, comprising the steps of:

(a) positioning a plurality of target cylinders in an enclosing chamber;

(b) positioning a plurality of electrode cylinders in the enclosing chamber such that each electrode cylinder is in coaxial and conformal relation to a one of the plurality of target cylinders to define spaces between inner bore surfaces of a one of the plurality of target cylinders or the plurality of electrode cylinders and outer surfaces of the other of the plurality of target cylinders or the plurality of electrode cylinders;

(c) generating a plasma of ions in the spaces between the inner bore surfaces and the outer surfaces; and (d) treating a one of the inner bore surfaces or outer surfaces with a material by applying a voltage differential in a pulse between the target cylinders and the electrode cylinders to accelerate the ions in the plasma toward one of the inner bore surfaces or the outer surfaces at an ion energy sufficient to impact the one of the inner bore surfaces or outer surfaces.

29. The method of claim 28 wherein the step of generating the plasma comprises generating a plasma by use of a glow discharge technique.

30. The method of claim 28 wherein the treating step includes the step of applying the voltage pulse differential to accelerate the ions to an ion energy sufficient to implant ions impacting the one of the inner bore surfaces or the outer surfaces beneath the one of the inner bore surfaces or the outer surfaces.

31. The method of claim 28 wherein the treating step includes the step of applying the voltage pulse differential to accelerate the ions to an ion energy sufficient to deposit ions impacting the one of the inner bore surfaces or outer surfaces onto the one of the inner bore surfaces or outer surfaces.

32. The method of claim 31 wherein the ions deposited on the one of the inner bore surfaces or outer surfaces form a diamond like carbon coating on the one of the inner bore surfaces or outer surfaces.

33. The method of claim 28 wherein the electrode cylinders are cathodes made of a material to be deposited by sputtering onto the targets.

34. The method of claim 33 wherein the step of generating the plasma comprises the step of applying a radio frequency voltage source to the electrode cylinders.

* * * * *